United States Patent [19]

Yoshida et al.

[11] Patent Number: 4,768,074
[45] Date of Patent: Aug. 30, 1988

[54] HETEROJUNCTION BIPOLAR TRANSISTOR HAVING AN EMITTER REGION WITH A BAND GAP GREATER THAN THAT OF A BASE REGION

[75] Inventors: Jiro Yoshida; Makoto Azuma, both of Yokohama, Japan

[73] Assignee: Kabushiki Kaisha Toshiba, Kawasaki, Japan

[21] Appl. No.: 110,042

[22] Filed: Oct. 13, 1987

Related U.S. Application Data

[63] Continuation of Ser. No. 799,111, Nov. 18, 1985, abandoned.

[30] Foreign Application Priority Data

Nov. 20, 1984 [JP] Japan .................. 59-244809
Jun. 20, 1985 [JP] Japan .................. 60-132918

[51] Int. Cl.$^4$ .................................. H01L 29/72
[52] U.S. Cl. .................................. 357/34; 357/4; 357/16
[58] Field of Search .................. 357/4, 16, 34

[56] References Cited

U.S. PATENT DOCUMENTS

4,053,920 10/1977 Enstrom .................. 357/16 X
4,117,504 9/1978 Maslov et al. .................. 357/16
4,558,336 12/1985 Chang et al. .................. 357/45 L

FOREIGN PATENT DOCUMENTS

60-175450 9/1985 Japan .................. 357/16

OTHER PUBLICATIONS

Hovel, H. J., "Graded Bandgap Heterojunction Bipolar Transistor" IBM Tech. Discl. Bull., vol. 22, No. 813, Jan. 1980, p. 3875.

H. Kroemer: "Hetrostructure Bipolar Transistors and Integrated Circuits", Proc. IEEE vol. 70, pp. 13-25, 1982.

Applied Physics Letters, vol. 43, No. 10, Nov. 1983, pp. 949-951, American Institute of Physics, New York, US; J. R. Hayes, et al.: "Optimum Emitter Grading for Heterojunction Bipolar Transistors" *FIG. 3a; p. 950, col. 2, lines 6-13*, Primary Examiner—Andrew J. James
Assistant Examiner—Sara W. Crane
Attorney, Agent, or Firm—Oblon, Fisher, Spivak, McClelland & Maier

[57] ABSTRACT

A heterojunction bipolar transistor comprises a base region of a first conductivity type formed of a first kind of semiconductor material, an emitter region of a second conductivity type formed of a second kind of semiconductor material which has a band gap greater than that of the first kind of semiconductor material and a smaller electron affinity, a transition region formed between the base region and the emitter region, and a collector region formed adjacent to the base region. The transition region is formed of a plurality of semiconductor layers such that band gaps sequentially increase in a stepped fashion from the semiconductor layer adjacent to the base region toward the semiconductor layer adjacent to the emitter region. The transition region is formed of a semiconductor material having an intermediate composition between the composition of the first kind of semiconductor material and that of the second kind of semiconductor material.

5 Claims, 8 Drawing Sheets

HETEROJUNCTION BIPOLAR TRANSISTOR HAVING AN EMITTER REGION WITH A BAND GAP GREATER THAN THAT OF A BASE REGION

This application is a continuation of application Ser. No. 799,111, filed on Nov. 18, 1985, now abandoned.

BACKGROUND OF THE INVENTION

This invention relates to a heterojunction bipolar transistor having an emitter region of a semiconductor material with a band gap greater than that of a semiconductor material of which a base region is formed.

The recent advance of an MBE (molecular beam epitaxy) and an MOCVD (metal organic chemical vapor deposition) method leads to the active development of semiconductor devices utilizing a heterojunction, i.e., a junction between dissimilar semiconductor materials. The heterojunction bipolar transistor with a heterojunction between the base and the emitter has many advantages over a conventional bipolar transistor with a homojunction formed of a single semiconductor material.

The advantages of the heterojunction bipolar transistor has, for example, the following advantages:

(1) Since an emitter region is formed of a semiconductor material having a band gap greater than that of a semiconductor material of which a base region is formed, it is possible to obtain a high emitter injection efficiency even if an impurity concentration ratio of the emitter region to the base region is smaller.

(2) As a result of (1), the impurity concentration level of the base region can be increased, thus enabling a decrease in a base resistance.

(3) As a result of (1), the impurity concentration level of the emitter region can be lowered, thus enabling a decrease in an emitter capacity.

As evident from these advantages, the heterojunction bipolar transistor is potentially, excellent in high frequency and switching characteristics over the homojunction bipolar transistor.

Of the semiconductor materials capable of actually providing such heterojunction bipolar transistor, a semiconductor material of a broader band gap is ordinarily smaller in electron affinity. As a result, if an npn transistor is manufactured which has stepped junctions formed directly between the emitter of a material offering a broader band gap and the base of a material offering a narrower band gap, then the injection efficiency will be lowered for the reason set out below. Thus, no advantage can be made of the merits of the heterojunction bipolar transistor.

FIG. 1 shows the state of a conduction band in the neighborhood of the base-to-emitter junction of a stepped heterojunction bipolar transistor in which the electron affinity of a semiconductor material of which the emitter region is formed is smaller by $\Delta E_C$ than that of a semiconductor material of which the base region is formed. As evident from FIG. 1, since a spike-like barrier of a level $\Delta E_C$ is formed in the conduction band due to a difference between the electron affinities mentioned, the electron injection from the emitter into the base region is blocked due to the presence of such barrier, causing a decline in emitter injection efficiency and a consequent degradation in the characteristic of the heterojunction bipolar transistor.

This problem is overcome by forming a graded heterojunction, in place of the stepped heterojunction, between the emitter and the base with a band gap smoothly varying from the emitter toward the base. FIG. 2 shows the state of the conduction band when, between the base and the emitter, a region is formed with a band gap varying in a linear fashion. As appreciated from FIG. 2, barriers produced in the conduction band can be removed using the graded heterojunction.

A region (hereinafter referred to as a transition region) with a band gap varying between the emitter region and the base region has a composition intermediate between the composition of a semiconductor material of which the base region is formed and that of a semiconductor material of which the emitter region is formed. In order for the band gap to be varied linearly, or smoothly in a quadratic fashion, in the transition region the composition ratio of the semiconductor material is gradually varied as shown in FIG. 3. In order to create such a transition region it is necessary to continuously and exactly vary the flux of a molecular beam for the MBE method or an amount of gas stream for the MOCVD method. In the present techniques, however, such control is difficult to attain and a high cost is required in providing such a control device. Furthermore, a transition region should be grown at an adequately slow speed, requiring a high manufacturing cost. When, moreover, the transition region is formed with a band gap varying smoothly, holes are liable to be injected from the base region into the transition region. In consequence, carrier recombinations are increased when, in particular, a shorter carrier lifetime is involved. This causes a drop in the DC current gain and an attendant degradation in high frequency and switching characteristics due to an increase in stored carriers. Therefore, a problem arises from the fact that the advantages of heterojunctions are impaired in the conventional heterojunction bipolar transistor.

SUMMARY OF THE INVENTION

It is accordingly the object of this invention to provide a heterojunction bipolar transistor which permits the ready control of a manufacturing process and has excellent DC and high frequency characteristics.

According to this invention there is provided a heterojunction bipolar transistor comprising:

a base region of a first conductivity type formed of a first kind of semiconductor material;

an emitter region of a second conductivity type formed of a second kind of semiconductor material which has a band gap greater than that of the first kind of semiconductor material and a smaller electron affinity;

a transition region formed between the base region and the emitter region and formed of a plurality of semiconductor layers with band gaps sequentially increasing in a stepped fashion from the semiconductor layer adjacent to the base region toward the semiconductor layer adjacent to the emitter region, the respective semiconductor layers having an intermediate composition between the composition of the first kind of semiconductor material and that of the second kind of semiconductor material; and a collector region formed adjacent to the base region.

According to this invention, barriers against electrons injected into the base from the emitter can be made lower in height, while at the same time leaving barriers of a certain height against holes which are injected from the base into the emitter. It is, therefore, possible to provide a heterojunction bipolar transistor which is excellent in the DC and high frequency characteristics. Furthermore, since no smooth composition variation is involved in the transition region, ready control can be imparted to the manufacturing process.

BRIEF DESCRIPTION OF THE DRAWINGS

Other objects and advantages will be apparent from the following description taken in conjunction with the accompanying drawings, in which.

DETAILED DESCRIPTION OF THE PREFERRED EMBODIMENTS

Figure 1:
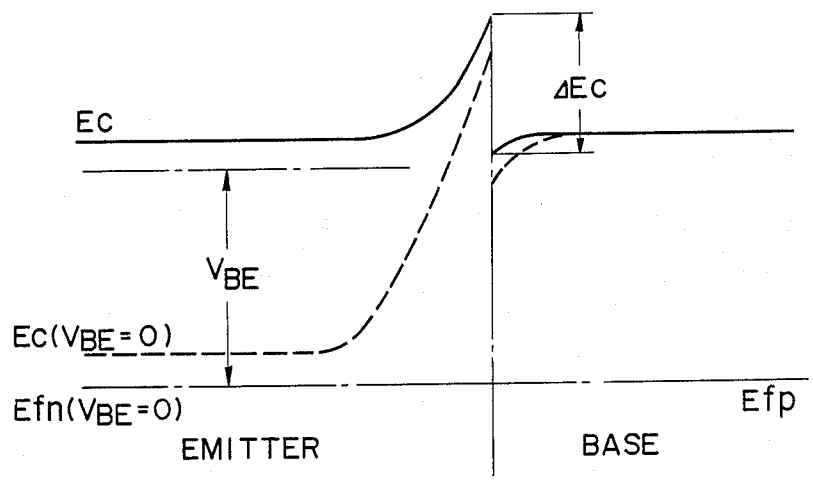
FIG. 1 is a view showing the state of a conduction band in the neighborhood of an emitter-to-base area of a stepped heterojunction bipolar transistor.
Figure 2:
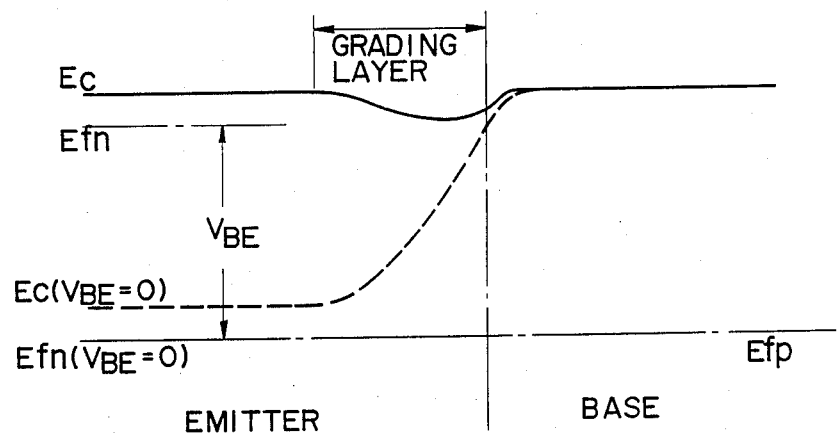
FIG. 2 is a view showing the state of a conduction band in the neighborhood of a graded heterojunction bipolar transistor.
Figure 3:
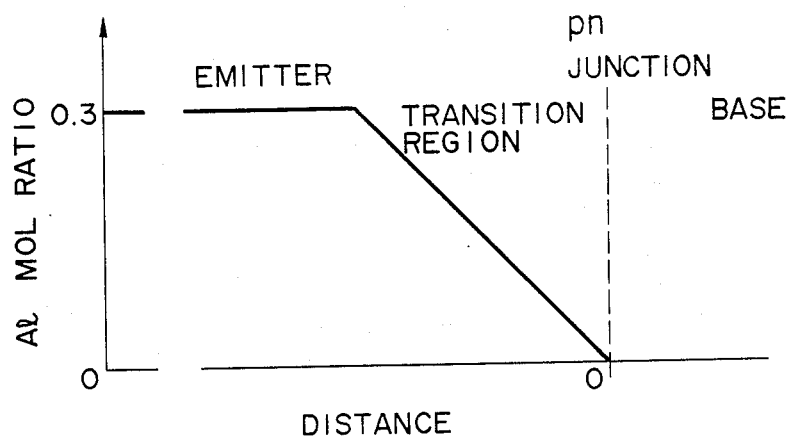
FIG. 3 shows the distribution of an Al mol ratio in the transition region of a conventional heterojunction bipolar transistor.
Figure 4:
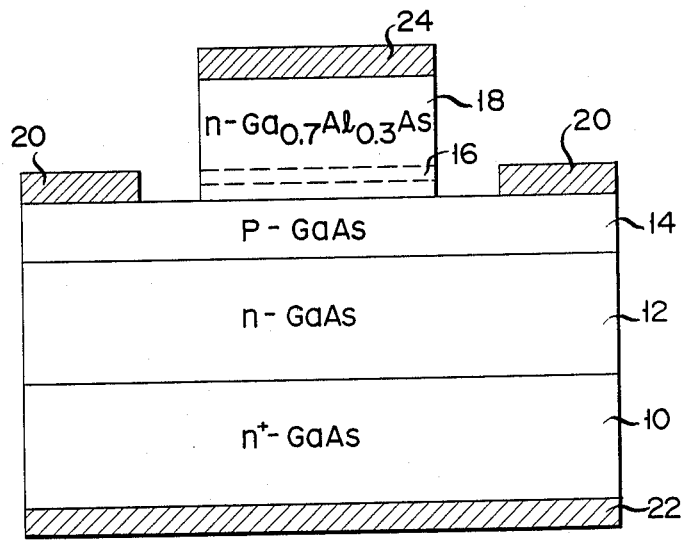
FIG. 4 is a cross-section showing a heterojunction bipolar transistor according to a first embodiment of this invention.

A heterojunction bipolar transistor according to a first embodiment of this invention will be explained below with reference to FIG. 4. The heterojunction bipolar transistor of this embodiment includes a broader band gap emitter of $Ga_{0.7}Al_{0.3}As$ and a narrower band gap base of GaAs. An n-type GaAs collector region 12 having an impurity, for example, Si is formed on an n+-type GaAs substrate 10. A p-type GaAs base region 14 having an impurity, for example, Be is formed on the collector region 12. A $Ga_{1-x}Al_xAs$ transition region 16 having an impurity, for example, Si is formed on the p-type GaAs base region 14. The transition region 16 comprises a plurality of layers having an Al composition ratio relative to Ga varying in a stepwise fashion. A broader band gap, n-type $Ga_{0.7}Al_{0.3}As$ emitter region 18 having an impurity, for example, Si is formed on the transition region 16. The n-type GaAs collector region 12, p-type GaAs base region 14, transition region 16 and $Ga_{0.7}Al_{0.3}As$ emitter region 18 are formed by the MBE or MOCVD method on the substrate in that order. Then, the n-type $Ga_{0.7}Al_{0.3}As$ emitter region 18 and transition region 16 are partly etched to expose the p-type GaAs base region 14. A base electrode 20 is formed so as to electrically connect to the p-type GaAs base region 14. A collector electrode 22 is formed on the n+-type GaAs collector region 10 and an emitter electrode 24 is formed on the n-type $Ga_{0.7}Al_{0.3}As$ emitter region 18.

Figure 5:
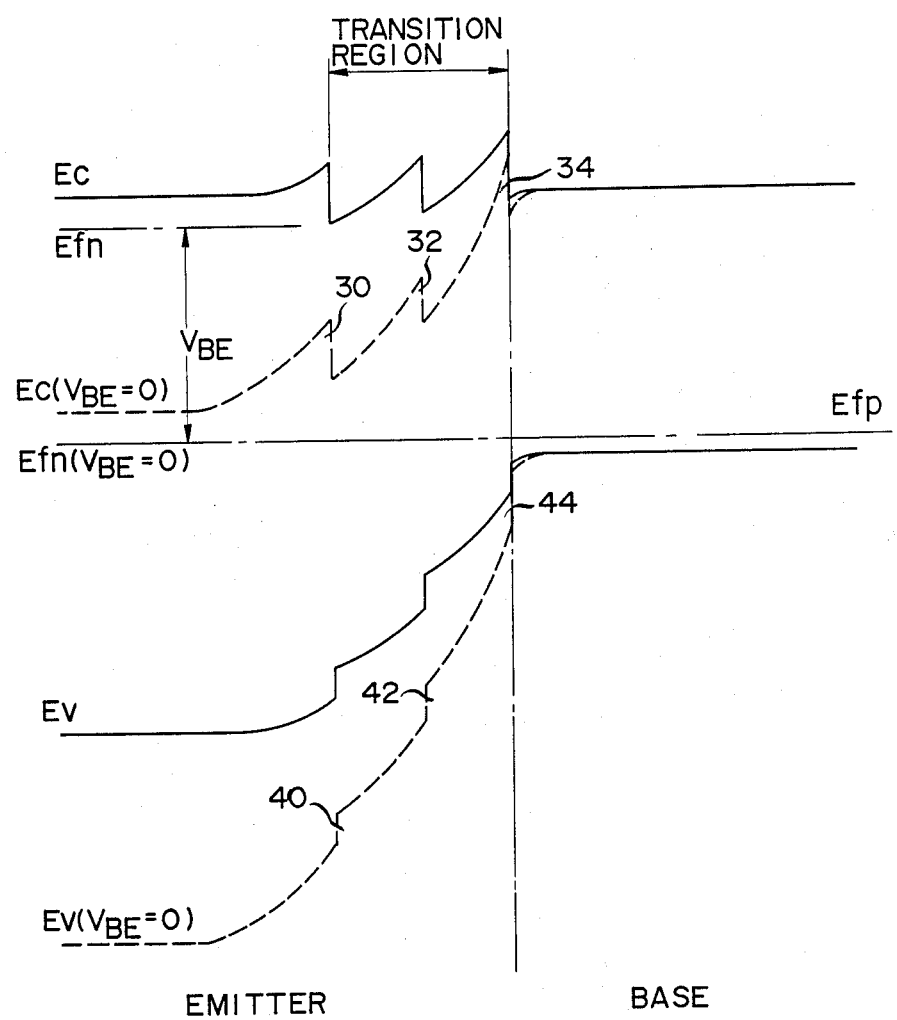
FIG. 5 is a view showing an energy band structure in the neighborhood of an emitter-to-base area of a heterojunction bipolar transistor of FIG. 4.

FIG. 5 shows a band configuration, as a model, in the neighborhood of the base-to-emitter area wherein the transition region 16 comprises two layers each having an intermediate composition between $Ga_{0.7}Al_{0.3}As$ of the emitter region 18 and GaAs of the base region 14. At interfaces among the emitter region 18, semiconductor layers comprised of the transition region 16 and base region 14, barriers 30, 32, 34 are formed in the conduction band. The height of the barriers is sufficiently smaller than in the case where the heterojunction is formed directly between the emitter and the base. A deeper injection of holes from the base into the transition region 16 is suppressed by barriers 40, 42 and 44 produced in the valence band. Even if carrier recombinations are prominently smaller in the transition region, it is smaller that the characteristic of the heterojunction bipolar transistor degrades due to the transition region 16 formed in the stepwise fashion. It is, therefore, possible to provide a heterojunction bipolar transistor having a sufficient practical performance characteristic.

The stepwise formation of the transition region 16 offers greater merits in forming a wafer for the heterojunction bipolar transistor by virtue of the MBE or the MOCVD method. If the material composition is smoothly varied as in the prior art, the growth requirements should precisely be controlled. It is also necessary to provide a sufficiently smaller growth rate. On the other hand, according to this embodiment, the growth requirements can be more readily controlled than in the prior art, since the composition ratio varies in the stepwise fashion. As a result, the wafer growth can be efficiently achieved with a shorter time period.

If the transition region inserted between the emitter and the base of the transistor is formed of a single intermediate layer structure made of semiconductor materials of which the emitter and base of the transistor are made, then the height of barriers in the conduction band which are produced on the base region side or the emitter region side cannot be made at a level one-half that in the absence of such a transition region. If the height of the barrier is to be made at a level lower than one-half that in the absence of the transition region, then it is necessary to adequately and precisely control the composition ratio of the single intermediate layer structure. In this case, therefore, no full utilization is made of the merits obtained by the insertion of the transition region. According to this invention, therefore, the transition region is formed of a plurality of semiconductor layers having a different material composition. That multilayer structure sequentially varies in the material composition ratio with the base region side semiconductor layer formed of a composition nearer to that of the base region and the emitter region side semiconductor layer formed of a composition nearer to that of the emitter region. In this way, the insertion of the transition region permits the ready composition ratio control of its semiconductor layers.

Figure 6:
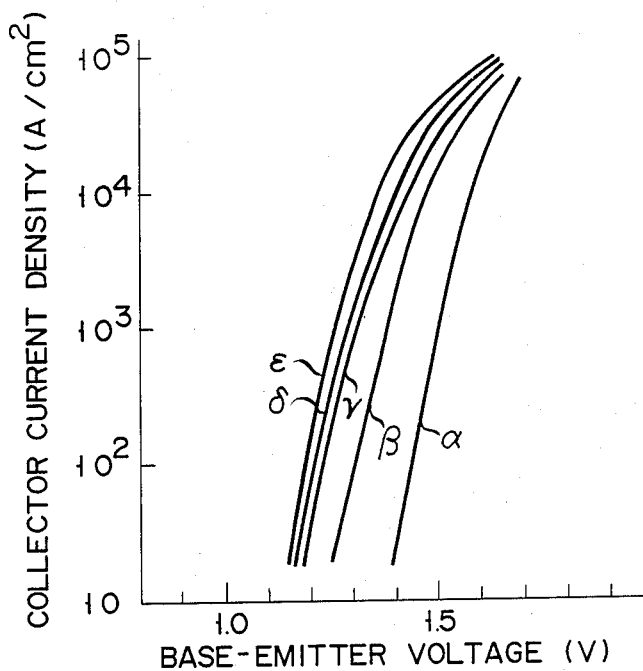
FIG. 6 shows a relation of a collector current density to a base-to-emitter voltage in the heterojunction bipolar transistor of the first embodiment, a comparison being made with a conventional transistor.
Figure 7:
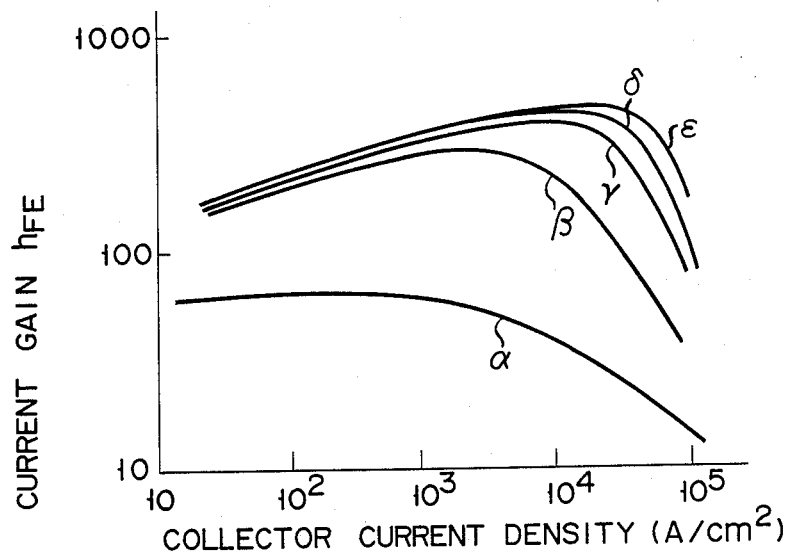
FIG. 7 shows a relation of a current gain to a collector current density in the heterojunction bipolar transistor of the first embodiment, a comparison being made with the conventional transistor.
Figure 8:
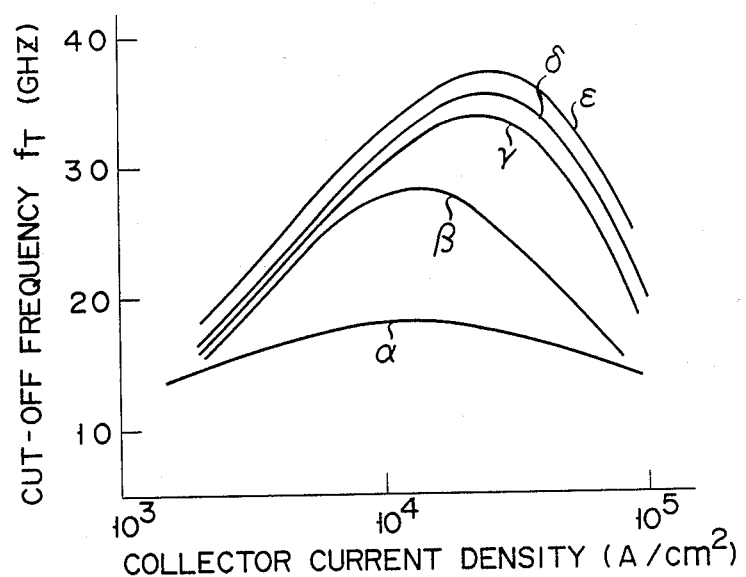
FIG. 8 shows a relation of a cut-off frequency to a collector current density in the heterojunction bipolar transistor of the first embodiment, a comparison being made with the conventional transistor.
Figure 9:
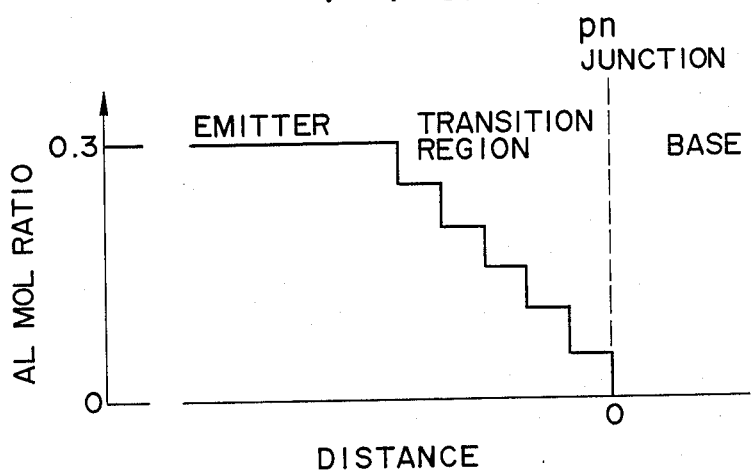
FIG. 9 shows the distribution of an Al mol ratio in the transition region of the heterojunction bipolar transistor of the first embodiment.

The effects of the embodiment of this invention will now be explained below on the basis of practical data. Suppose that the emitter region 18 and transition region 16 have a doping concentration level of $3 \times 10^{17}$ cm$^{-3}$ and that the base region 14 has a doping concentration of $3 \times 10^{18}$ cm$^{-3}$. The transition region 16 was formed using various methods and comparison was made with respect to the characteristics of the heterojunction bipolar transistor as shown in FIGS. 6 to 8. FIG. 6 shows a current-to-voltage characteristic; FIG. 7 shows the dependence of the current gain on the collector current density; and FIG. 8 shows the dependence of a cut-off frequency on the collector current density. In FIGS. 6 to 8, $\alpha$ indicates the case where no transition region is formed; $\beta$ indicates the case where a 200 Å-thick transition region is formed which is comprised of a single layer with an Al mol ratio of 0.15; $\gamma$ indicates the characteristic of a transistor having the transition region made of a two semiconductor layered structure with one layer formed with a thickness of 100 Å and an Al mol ratio of 0.1 and the other layer formed with a thickness of 100 Å and an Al mol ratio of 0.2; and $\delta$ indicates the case where a transition layer is formed of a five semiconductor layered structure with the respective five layers formed with a thickness of 40 Å and Al mol ratios 0.05, 0.1, 0.15, 0.2 and 0.25, respectively. The state of the transition layer is shown in FIG. 9. In FIGS. 6 to 8, $\epsilon$ shows the characteristic of a transition having the transistor region of 200 Å in thickness with the Al mol ratio linearly varying over a range of 0.0 to 0.3. In this connection it is to be noted that the curves $\Delta$ and $\delta$ show the characteristic of the transistor according to the embodiment of this invention and that $\alpha$, $\beta$ and $\epsilon$ show the characteristic of another heterojunction bipolar transistors.

The data in FIGS. 6 to 8 corresponds to the case where carrier recombinations are not prominently formed in the transition region. From this it will be seen that the element (curve $\epsilon$) having a transition region with the Al composition ratio varying in the linear fashion reveals the best characteristics. As evident from these Figures, however, the elements of this invention (curves $\Delta$ and $\delta$) having a stepped transition region of two or more layers are not significantly worse in their characteristics than the characteristics of the element as indicated by the curve $\epsilon$. As set out above, the transition region of the heterojunction bipolar transistor of this invention can be more readily formed than that of the conventional counterpart (curve $\epsilon$). In consequence, the heterojunction bipolar transistor according to this invention proves useful as compared with the conventional counterparts.

Figure 10:
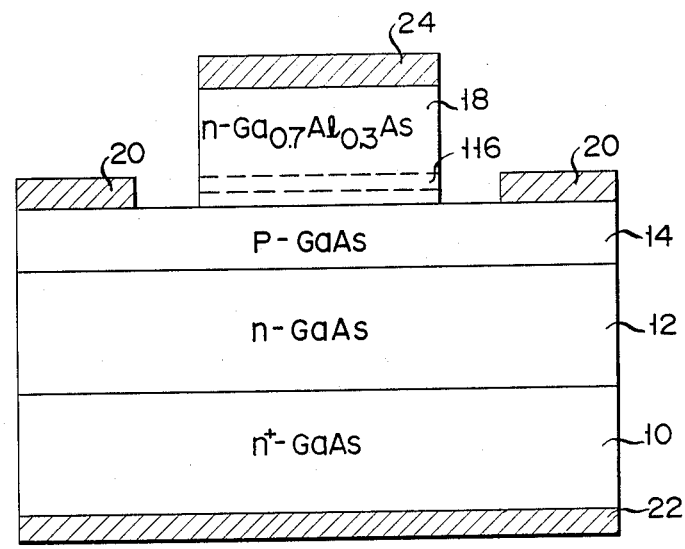
FIG. 10 is a cross-sectional view showing a heterojunction bipolar transistor according to a second embodiment of this invention.
Figure 11:
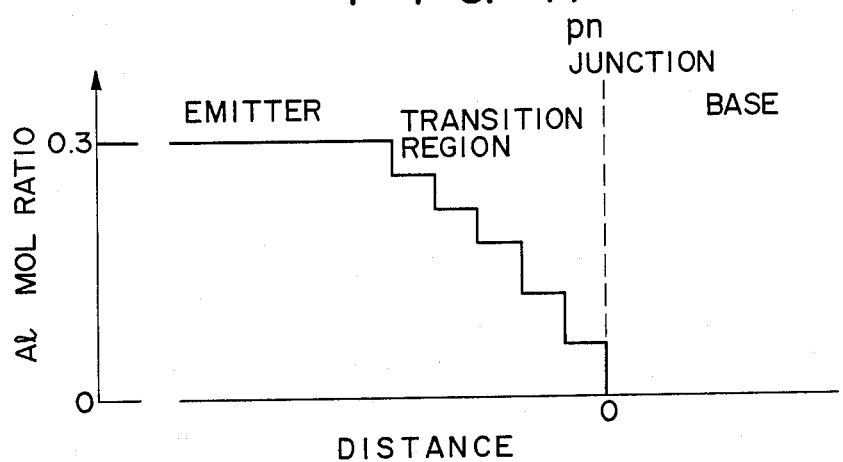
FIG. 11 shows the distribution of an Al mol ratio in the transition region of the heterojunction bipolar transistor of the second embodiment.

A heterojunction bipolar transistor according to a second embodiment of this invention will be explained below with reference with FIG. 10. In this embodiment, a transition region 116 is formed of a plurality of semiconductor layers. The multi-layered structure has its aluminum composition ratio varying in the stepwise fashion. This embodiment is different from the first embodiment in that differences each between the band gaps of the adjacent semiconductor layers do not equidistantly vary in the transition region and that the transition region 116 is formed with a greater band gap difference produced between the semiconductor layers situated near the base region 14 and a smaller band gap difference produced between the semiconductor layers situated near the emitter region 18. For example, the transition region 116 is so formed as shown in FIG. 11. Since the other arrangement is the same as that of the first embodiment of this invention, further explanation is omitted with the same reference numerals employed in FIG. 10 to designate parts or elements corresponding to those shown in FIG. 4.

Barriers are formed in the conduction band at interfaces which are formed among the emitter region 18, semiconductor layers of which the transition region 116 is formed, and base region 14. The height of the barriers can be made adequately smaller than in the case where a heterojunction is formed directly between the emitter and the base of the transistor. On the other hand, the deeper injection of holes from the base into the transition region 116 is suppressed due to the barriers formed in the valence band. Although the above-mentioned advantage is obtained even in the first embodiment, a still greater advantage can be obtained according to the second embodiment of this invention.

Where the transition region 116 is formed like the first embodiment, in a stepped fashion, a greater merit is obtained in forming a wafer for heterojunction bipolar transistors by virtue of the MBE or the MOCVD method. In order for the material composition ratio to be smoothly varied as the conventional transistor, it is necessary to precisely control the growth requirements and it is also necessary to adequately reduce the growth rate. The composition ratio of the transition region 116 varying in a stepwise fashion as in this invention, the growth requirements can be more readily controlled than according to the conventional method. As a result, the wafer can be efficiently grown with a short period of time.

The effect of the transistor according to the embodiment of this invention will be more clearly explained on the basis of practical data.

Figure 12:
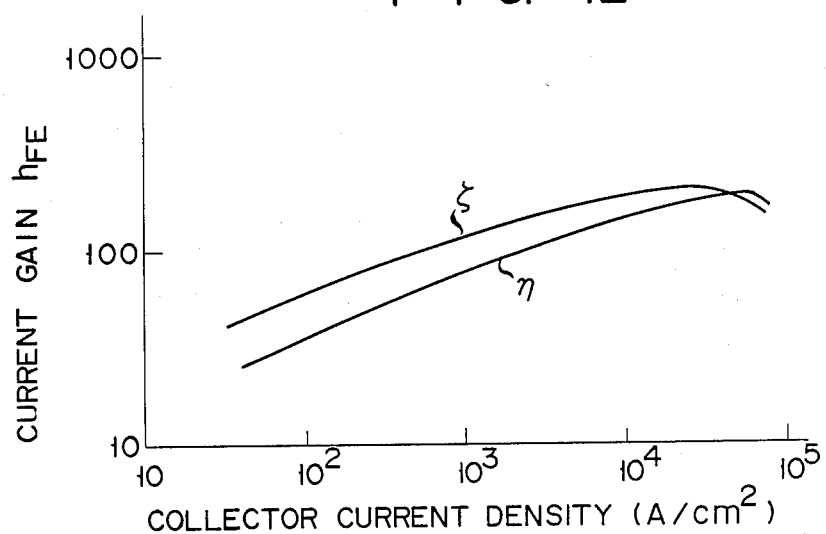
FIG. 12 shows a relation of a current gain to a collector current density in the heterojunction bipolar transistor of the second embodiment, a comparison being made with the conventional transistor.
Figure 13:
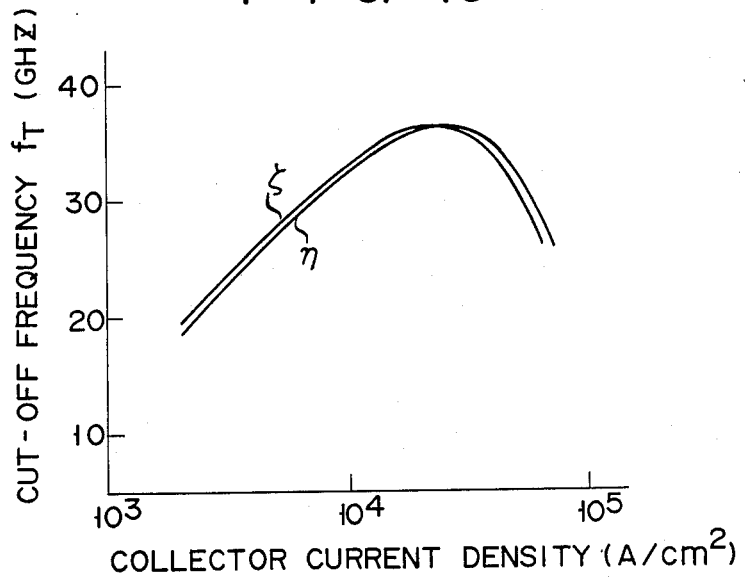
FIG. 13 shows a graph showing a relation of a cutoff frequency to a collector current density in the heterojunction bipolar transistor of the second embodiment, a comparison being made with the conventional transistor.

The emitter region 18 and transition region 116 were set to have a doping concentration level of $3 \times 10^{17}$ cm$^{-3}$ and the base region 14 was set to have a doping concentration level of $3 \times 10^{18}$ cm$^{-3}$. The heterojunction bipolar transistor, according to this invention, having the transition region is compared in its characteristics with the conventional heterojunction bipolar transistor having the transition region with a band gap varying smoothly in a linear fashion. FIG. 12 shows the dependence of the current gain on the collector current density. FIG. 13 shows the dependence of the cut-off frequency on the collector current density. The curve $\zeta$ shows the characteristics of the transistor of this embodiment. The transition region 116 is formed of a five semiconductor layered structure with the five respective layers having 40 Å in thickness and with an aluminum mol ratios 0.06, 0.12, 0.18, 0.22 and 0.26 distributed from the base region 14 toward the emitter region 18, as shown in FIG. 11. On the other hand, the curve $\eta$ shows the characteristics of a conventional heterojunction bipolar transistor having a 200 Å-thick transition region with an Al mol ratio linearly varying in a range of 0.0 to 0.3. From FIG. 12 it is evident that, in a collector current density range of below $5 \times 10^4$ A/cm$^2$ over which an ordinary transistor is used, the heterojunction bipolar transistor of this embodiment has an excellent characteristic over that of the conventional heterojunction bipolar transistor. In the collector current density range over which the ordinary transistor is used, the heterojunction bipolar transistor of this embodiment shows an excellent characteristic as evident from FIG. 13, though being not so prominent as shown in FIG. 12.

Figure 14:
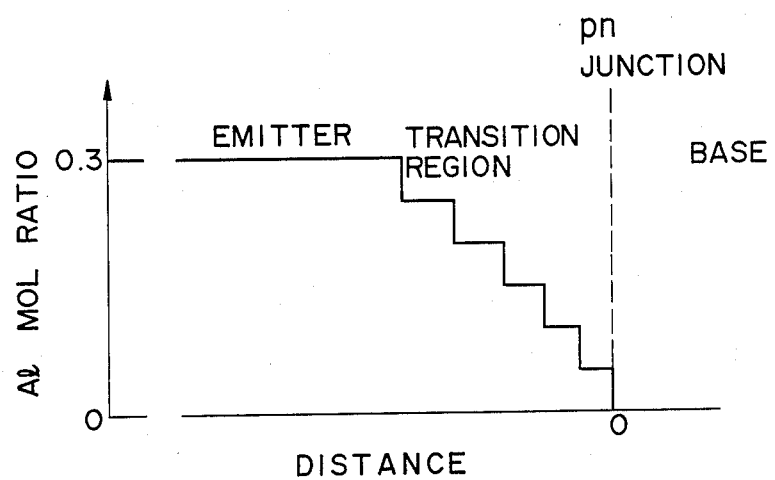
FIG. 14 is a view showing the distribution of an Al mol ratio in the transition region of a heterojunction bipolar transistor according to another embodiment of this invention.

This invention is not restricted to the above-mentioned embodiment. The transition region may be formed such that aluminum varies, in the same mol ratio, among the respective semiconductor layers of the transition region, and that the semiconductor layer situated near the base region is made narrower and that the semiconductor layer situated near the emitter region is made broader, as shown in FIG. 14. Even in this case it is possible to obtain the same advantage as those of the first and second embodiments.

Although in the above-mentioned embodiment the base and emitter have been explained as being formed of GaAs and Ga$_{0.7}$Al$_{0.3}$As, respectively, this invention can equally been applied to the case where the aluminum mol ratio of the emitter is below 0.3. Furthermore, this invention can be applied to the case where, as a material of which the emitter and base are formed, use is made of other combinations, such as a combination of InP and InGaAs, of GaAs and Ge and of GaP and Si.

What is claimed is:

1. A heterojunction bipolar transistor comprising:
    a base region of a first conductivity type formed of GaAs;
    an emitter region of a second conductivity type formed of Ga$_n$Al$_{1-n}$As which has a band gap greater than that of GaAs and a smaller electron affinity;
    a transition region formed between the base region and the emitter region and formed of a plurality of semiconductor layers with band gaps sequentially increasing in a stepped fashion from the semiconductor layer adjacent to the base region to the semiconductor layer adjacent to the emitter region, the respective semiconductor layer having an intermediate composition between the composition of GaAs and that of Ga$_n$Al$_{1-n}$As and having a sufficient thickness to generate potential barriers in a conduction band and a valence band; and
    a collector region formed adjacent to said base region.

2. The transistor according to claim 1, in which a difference in a band gap between said base region and the semiconductor layer in the transition region which is situated adjacent to said base region is not smaller than a difference in a band gap between the other mutually adjacent semiconductor layers in said transition region.

3. The transistor according to claim 1, wherein each Al mol ratio of the plurality of semiconductor layers varies in a stepwise fashion, the difference of the Al mol ratio between adjacent semiconductor layers is equal and each thickness of the plurality of semiconductor layers is equal.

4. The transistor according to claim 1, wherein each Al mol ratio of the plurality of semiconductor layers varies in a stepwise fashion and the difference of the Al mol ratio between adjacent semiconductor layers at the base region side is higher than that of the Al mol ratio between adjacent semiconductor layers at the emitter region side.

5. The transistor according to claim 1, wherein each Al mol ratio of the plurality of semiconductor layers varies in a stepwise fashion and the thickness of the semiconductor layer adjacent to the base region is narrower than that of the semiconductor layer adjacent to the emitter region.

* * * * *